US009607915B2

(12) United States Patent
Erlesand et al.

(10) Patent No.: US 9,607,915 B2
(45) Date of Patent: Mar. 28, 2017

(54) THROUGH SUBSTRATE VIAS AND DEVICE (71) Applicant: SILEX MICROSYSTEMS AB, Jarfalla (SE)

(72) Inventors: Ulf Erlesand, Osterskar (SE); Edvard Kälvesten, Hagersten (SE)

(73) Assignee: SILEX MICROSYSTEMS AB, Jarfalla (SE)

( * ) Notice: Subject to any disclaimer, the term of this patent is extended or adjusted under 35 U.S.C. 154(b) by 0 days.

(21) Appl. No.: 14/440,084

(22) PCT Filed: Oct. 31, 2013

(86) PCT No.: PCT/SE2013/051273
§ 371 (c)(1),
(2) Date: May 1, 2015

(87) PCT Pub. No.: WO2014/070091
PCT Pub. Date: May 8, 2014

(65) Prior Publication Data
US 2015/0279756 A1 Oct. 1, 2015

(30) Foreign Application Priority Data
Nov. 1, 2012 (SE) ...................................... 1251236

(51) Int. Cl.
*H01L 23/15* (2006.01)
*C25D 5/02* (2006.01)
(Continued)

(52) U.S. Cl.
CPC .............. *H01L 23/15* (2013.01); *B81B 7/007* (2013.01); *B81C 1/00095* (2013.01); *C25D 5/02* (2013.01);
(Continued)

(58) Field of Classification Search
None
See application file for complete search history.

(56) References Cited

U.S. PATENT DOCUMENTS

| 7,259,080 B2 | 8/2007 | Quenzer et al. |
| 7,416,961 B2 | 8/2008 | Quenzer et al. |

(Continued)

FOREIGN PATENT DOCUMENTS

| WO | 2007070004 | 6/2007 |
| WO | 2012008578 | 1/2012 |

OTHER PUBLICATIONS

International Search Report, dated Apr. 25, 2014, from corresponding PCT application.

*Primary Examiner* — Angel Roman
(74) *Attorney, Agent, or Firm* — Young & Thompson (57) ABSTRACT

Method of making through-substrate-vias in glass substrates includes providing a first substrate on which a plurality of needles protruding vertically from the substrate are made; providing a second substrate made of glass; locating the substrates adjacent each other such that the needles on the first substrate face the second substrate; applying heat to a temperature where the glass softens, by heating the glass or the needle substrate or both; applying a force such that the needles on the first substrate penetrate into the glass to provide impressions in the glass; and finally, removing the first substrate and providing material filling the impressions in the second substrate made of glass. A device includes a silicon substrate having a cavity in which a MEMS component is accommodated, and a cap wafer made of a material having a low dielectric constant, and through substrate vias of metal, is bonded to the silicon substrate.

6 Claims, 12 Drawing Sheets

(51) Int. Cl.
*H01L 21/768* (2006.01)
*H01L 23/498* (2006.01)
*H01L 21/50* (2006.01)
*B81C 1/00* (2006.01)
*B81B 7/00* (2006.01)

(52) U.S. Cl.
CPC ........ *H01L 21/50* (2013.01); *H01L 21/76879* (2013.01); *H01L 23/49827* (2013.01); *H01L 23/49872* (2013.01); *H01L 2924/0002* (2013.01)

(56) References Cited

U.S. PATENT DOCUMENTS

| | | | | |
|---|---|---|---|---|
| 8,324,006 | B1* | 12/2012 | Adler | B06B 1/0292 257/416 |
| 2002/0066672 | A1 | 6/2002 | Iijima et al. | |
| 2003/0178726 | A1 | 9/2003 | Ogawa et al. | |
| 2004/0077154 | A1* | 4/2004 | Nagarajan | B81B 7/007 438/455 |
| 2005/0060886 | A1 | 3/2005 | Tsukahara et al. | |
| 2005/0156694 | A1* | 7/2005 | Park | B81B 7/007 333/262 |
| 2006/0033189 | A1* | 2/2006 | Haba | B81B 7/007 257/678 |
| 2008/0029863 | A1* | 2/2008 | Eskridge | B81C 1/00301 257/678 |
| 2010/0290199 | A1* | 11/2010 | Schmid | B81C 1/0023 361/752 |
| 2010/0304518 | A1* | 12/2010 | Suminto | B81C 1/00158 438/51 |
| 2011/0133295 | A1* | 6/2011 | Fujii | G01P 15/0802 257/415 |
| 2011/0147859 | A1* | 6/2011 | Tanaka | B81B 7/007 257/415 |
| 2012/0223410 | A1* | 9/2012 | Fujii | H01L 21/76898 257/507 |
| 2013/0221510 | A1* | 8/2013 | Couillard | B81C 3/001 257/685 |

* cited by examiner

THROUGH SUBSTRATE VIAS AND DEVICE

The present invention relates to making vias in substrates with low dielectric constant for MEMS applications. In particular it relates to such applications having reduced stray capacitance.

BACKGROUND OF THE INVENTION

In the MEMS technology area there is a continuous strive to reduce component size and in particular the thickness of components in order to enable making e.g. mobile phones thinner.

DESCRIPTION OF THE RELATED ART

Today most MEMS components comprise so called vias for routing signals from a signal generating element through a substrate for further routing to electronic circuits for signal processing. In particular so called TSVs (Through Silicon Vias) are common, and there are numerous technologies relating to this kind of vias.

Examples of the mentioned signal generating elements are accelerometers, gyros, etc. In particular when the signal is based on capacitance changes, the actual detected signal variation can be as small as in the femto- to atto-Farad range ($10^{-15}$ to $10^{-18}$ F). This should be considered in relation to the stray capacitances caused by the vias themselves, which commonly for TSVs based on silicon can be in the range 1-5 pF, and for metal vias in the range 5-20 pF. Thus, as can be understood very sophisticated signal processing is required in order to single out the relevant parts of the total signal.

For RF (Radio Frequency) applications in MEMS structures and devices the dielectric properties of the support structures is of great importance, and it is desirable to eliminate "cross-talk" between neighbouring components or elements on chips or wafers on which the components in question are provided.

The most commonly used material for building MEMS structures and devices is silicon, which is a material having a comparatively high dielectric constant. Also the permeability constant is an important factor that controls coupling between substrate and components.

However, most often the silicon is doped in order to increase conductivity and thus, the conductivity will contribute to negative effects.

Stray capacitances are the most important negative factor in both RF applications and in capacitive measurements, and silicon inherently will cause such problems.

It would therefore be desirable to provide a technology wherein the stray capacitances of the via structures could be reduced substantially.

Since the stray capacitance is dependent on the area of the circumference of a via, a reduction in size, preferably the diameter, but also a reduction of the length would be desirable. The reduction in length is automatically given by the requirement to reduce substrate thickness. The capacitance is also dependent on the material in the substrate. When the vias are made in silicon wafers such that the actual via is insulated from the substrate by an oxide, there will occur a capacitance across the insulator, and when the via is made of metal there will occur a capacitance across the substrate, i.e. between the metal and some ground point.

One solution to this problem is to use glass substrates which are very much less conductive than silicon.

A technology for making vias in glass is marketed by Planoptik who claims a patented process for this. This process, disclosed in U.S. Pat. No. 7,416,961 and U.S. Pat. No. 7,259,080, entails providing impressions in a silicon wafer, connecting the silicon wafer to a glass wafer with negative pressure to create an under pressure in the impressions within the silicon wafer, and in a tempering step allowing a glass wafer melt and flow into said impressions. Removal of material from both sides of the composite wafer package thus created results in a glass wafer penetrated by a multiplicity of semiconductor perforations. Thus, this process requires the creation of an under pressure (negative pressure) inside the impressions.

SUMMARY OF THE INVENTION

In view of the demands for smaller dimensions in the MEMS field, and the problems encountered thereby, the object of the present invention is to provide an improved method of forming electrical through-connections in substrates with low dielectric constants, such as glass, which enables thinner substrates, and which reduces stray capacitances considerably compared to silicon based technology.

This object is met with a method as defined in claim 1.

Thus, in a first aspect there is provided a method of making substrates of a material with a low dielectric having through-substrate-vias (TSVs) of metal, preferably glass substrates with through-glass-vias (TGVs) of metal.

The main feature of the method is that needles, in preferred embodiments of silicon provided on a silicon substrate, optionally coated with metal, are pressed under pressure into a glass substrate which is heated to a temperature at which it is deformable. Optionally also the substrate and needles thereon are heated too, either inductively or by using a "hot plate" in contact with the substrate. Also, in alternative embodiments the needles can be entirely of metal.

Alternative embodiments are provided, and are defined in the dependent claims.

In a first embodiment the needles are used to make a mold in the glass by pressing them into the softened glass substrate and withdrawing them. The needles in this embodiment can be of any suitable material that withstands the processing conditions. Subsequently the holes made by the needles are filled with molten metal. The substrate is grinded to planarity to provide the vertical through-connections flush with the substrate surface.

In a second embodiment the needles, which suitably are made of silicon, are metallized and pressed into the softened glass substrate. When the glass is solidified, the carrier substrate on which the needles are provided is removed leaving the metallized needles buried in the glass. After grinding to expose the tips of the needles the desired vertical through-connections are obtained.

In a third embodiment a first substrate with needles is used, the needles are pressed into the softened glass, and withdrawn, whereby holes are made in the glass substrate. Then a second substrate with needles having a thin metal coating are inserted into the holes. Thereby the diameter may be just a fraction larger than the hole diameter in order to provide a tight fit. In this embodiment the risk for the metal coating coming off during insertion is reduced compared to the second embodiment.

In another aspect the method provides a starting substrate for MEMS engineering, as discussed below.

In a further aspect a glass substrate having metal TGVs is used as a capping wafer for MEMS devices.

A MEMS device incorporating a capping structure according to this aspect of the invention is discussed below.

DETAILED DESCRIPTION

Generally, the invention relates to a method of making through-substrate-vias in substrates having low dielectric constant, such as glass or synthetic polymers, comprising the steps of providing a first substrate on which a plurality of vertically protruding needles are provided (i.e. protruding vertically from the substrate); providing a second substrate made of a material having a low dielectric constant, e.g. glass; locating the substrates adjacent each other such that the needles on the first substrate face the second substrate; heating the second substrate made of a material having a low dielectric constant to a temperature where it softens, preferably without melting; applying a force on the first substrate such that the needles thereon penetrate into the material having a low dielectric constant to provide impressions in the material; and removing the first substrate and providing material filling the impressions in the second substrate made of material having a low dielectric constant. Suitably the second substrate is grinded on both sides to provide planar surfaces such that the material filling the impressions becomes exposed. Preferably the material filling the impressions is silicon, optionally doped and/or further comprises metal in a layer at the interface against the material having a low dielectric constant in the substrate. In one embodiment the entire first substrate with its needles is removed from the substrate material having a low dielectric constant to leave a structured substrate having a plurality of impressions formed therein, and the impressions are filled with metal. Alternatively the entire first substrate with its needles is removed from the substrate material having a low dielectric constant to leave a structured substrate having a plurality of impressions formed therein; providing a third substrate having needles provided thereon; inserting the needles into said impressions; removing the substrate but breaking off the needles leaving the needles inside the impressions; and grinding both sides of the substrate of a material having a low dielectric constant to provide planar surfaces such that the needles filling the impressions becomes exposed. In this embodiment the needles suitably have a slightly larger diameter than the impressions. In a further embodiment the step of removing the substrate comprises separating the substrate from the needles such that the needles remain in the impressions; and grinding both sides of the substrate of a material having a low dielectric constant to provide planar surfaces such that the needles filling the impressions becomes exposed.

The resulting wafer having TGVs of silicon can be used as a capping wafer for a MEMS device. In particular it is useful in applications where it is desirable that stray capacitances of the via structures are reduced substantially, such as in accelerometers, gyros, etc., where capacitive sensing is used.

Figure 1A:
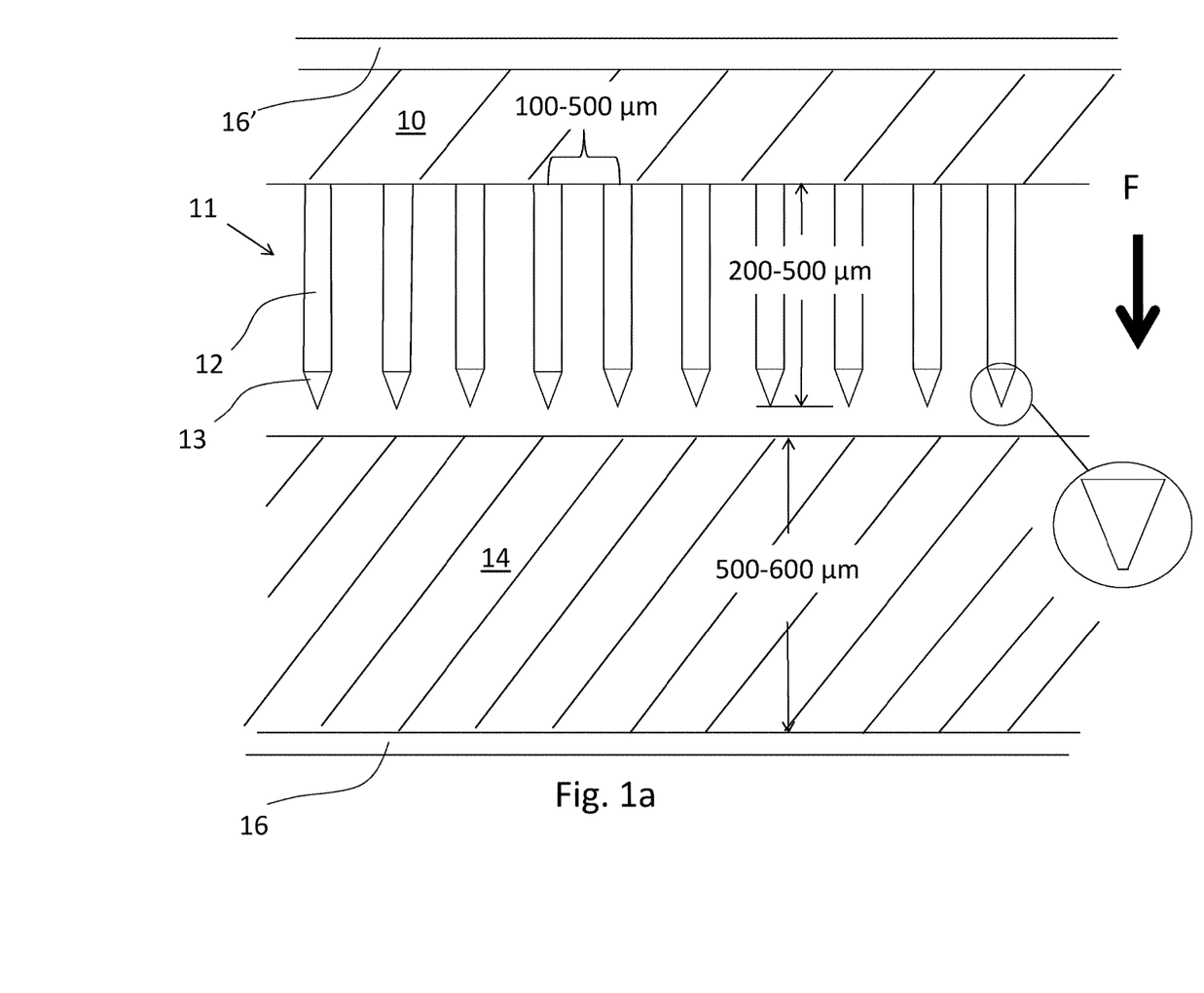
FIG. 1a illustrates schematically a substrate with needles and a glass substrate before they are pressed together.
Figure 1B:
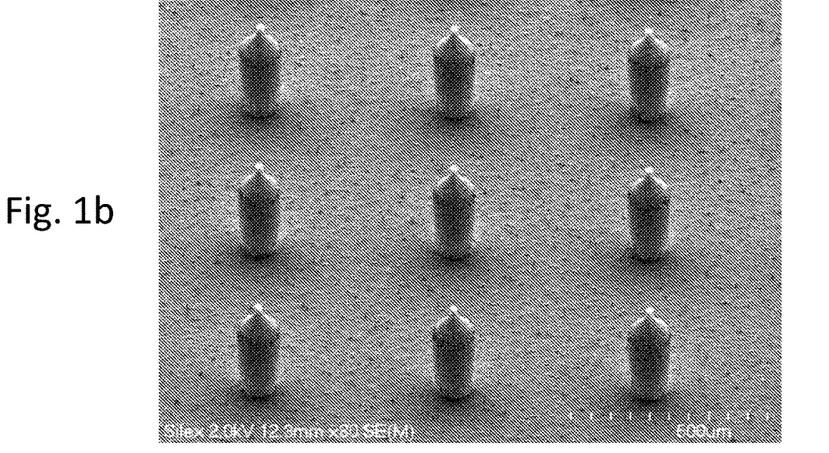
FIG. 1b is a SEM image of a real needle.
Figure 1C:
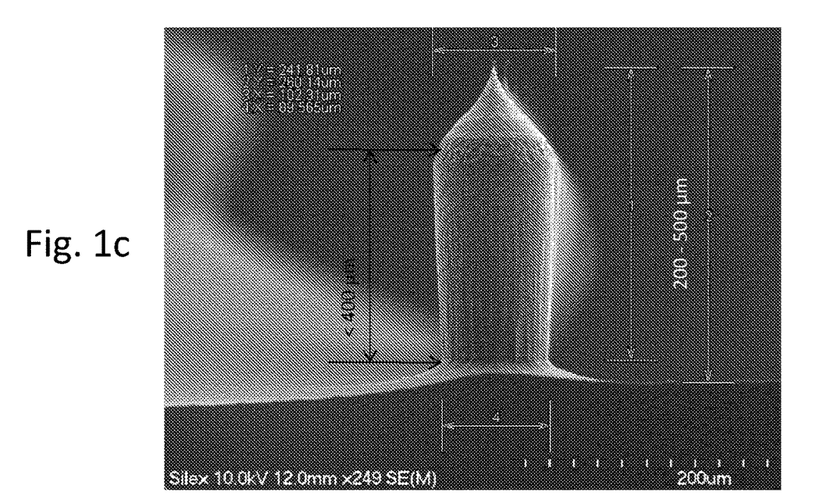
FIG. 1c illustrates the how the metal coating can be sheered or peeled off the needle when pressed into a glass substrate.
Figure 2:
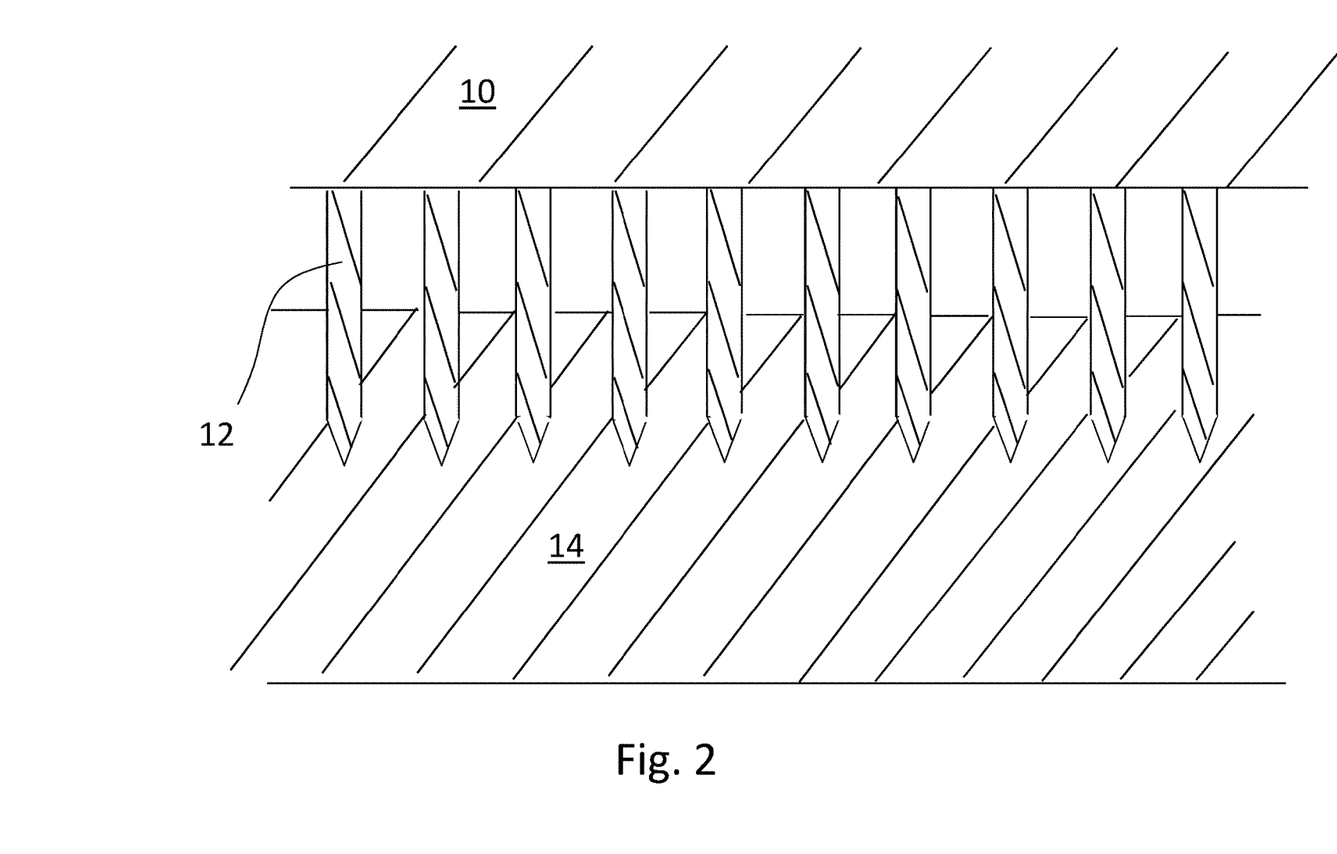
FIG. 2 illustrates schematically the substrate now pressed into the glass substrate.

One embodiment of the method is schematically illustrated in FIGS. 1 and 2, and it should be noted that the structures are not shown to scale. Thus, a silicon substrate 10 is provided with an array of needles 11 protruding vertically from the substrate surface, and having a needle stem 12 and a tapered or pointed head 13. However, the heads must be robust enough to withstand the forces during penetration without fragments coming off. Thus, the shapes shown in the figures are schematic, and in reality they would preferably look more like in the insert of FIG. 1a. A real example in the form of a SEM image of a needle that was actually made is shown in FIG. 1b. Here it can be seen that the tips are pointed but has a flat surface at the very tip thereof, in order to avoid that the very tip portion be broken off during penetration. In FIG. c an individual needle is shown. Here it can be seen that the tip is "low" and "wide" and hence robust, although it still has a fairly pointed tip. The dimensions of this needle is typical, i.e. having a height in the range of about 200-500 µm, with a diameter in the range of about 100 µm. Such needles can be made by any method available to the skilled man. Suitable methods are disclosed in applicants own WO 2007/070004 A2.

It is notable and one of the great advantages of the invention that the via pitch, i.e. center-to-center distance of the vias can be made small, in the interval 100-500 µm, due to the fact that needles can be made with a tight pitch.

A glass substrate 14 is also provided. Suitable glass qualities are boron silicate glass, phosphorous based glass. The glass substrate is heated by suitable means such as by placing it on a hot plate 16, to about 650° C., such that it becomes deformable. It should not be heated to the point where it begins to melt though. The actual temperature is of course material dependent, and the purer the glass is the higher the temperature can be. Also, the actual metal used sets limits to the usable temperatures. Thus, temperatures in the range 400-1000° C. are possible. It is of course also possible to heat the needle substrate too, in which case there can be provided a hot plate 16' in contact therewith. The advantage of not melting the glass is that the glass structure is preserved.

The silicon substrate 10 with its needles 11 is positioned above the glass substrate (as seen in the figure) in a set which allows the silicon substrate to be moved towards the glass substrate and there is also provided suitable means to allow application of a pressure force F on the silicon substrate. Of course the orientation of the substrates could be the opposite. The means for applying pressure could be any type of mechanical device such as pneumatic, hydraulic or purely mechanical, as long as it is possible to apply a controlled and constant force that makes the needles penetrate into the glass substrate in a controlled manner.

In FIG. 2 the situation where the needles under pressure have penetrated the glass 14 to some extent, here about half the length of the needles are shown to have been pressed into the glass. However, ideally the entire needle length should penetrate the glass, but this is in practice impossible. Then the substrate is removed from the needles by suitable techniques, in which case the glass substrate will function as a carrier. On the other hand, if desired, the glass can be grinded to expose the needles before removing the silicon substrate, in which case the silicon substrate will function as the carrier.

Figure 3:
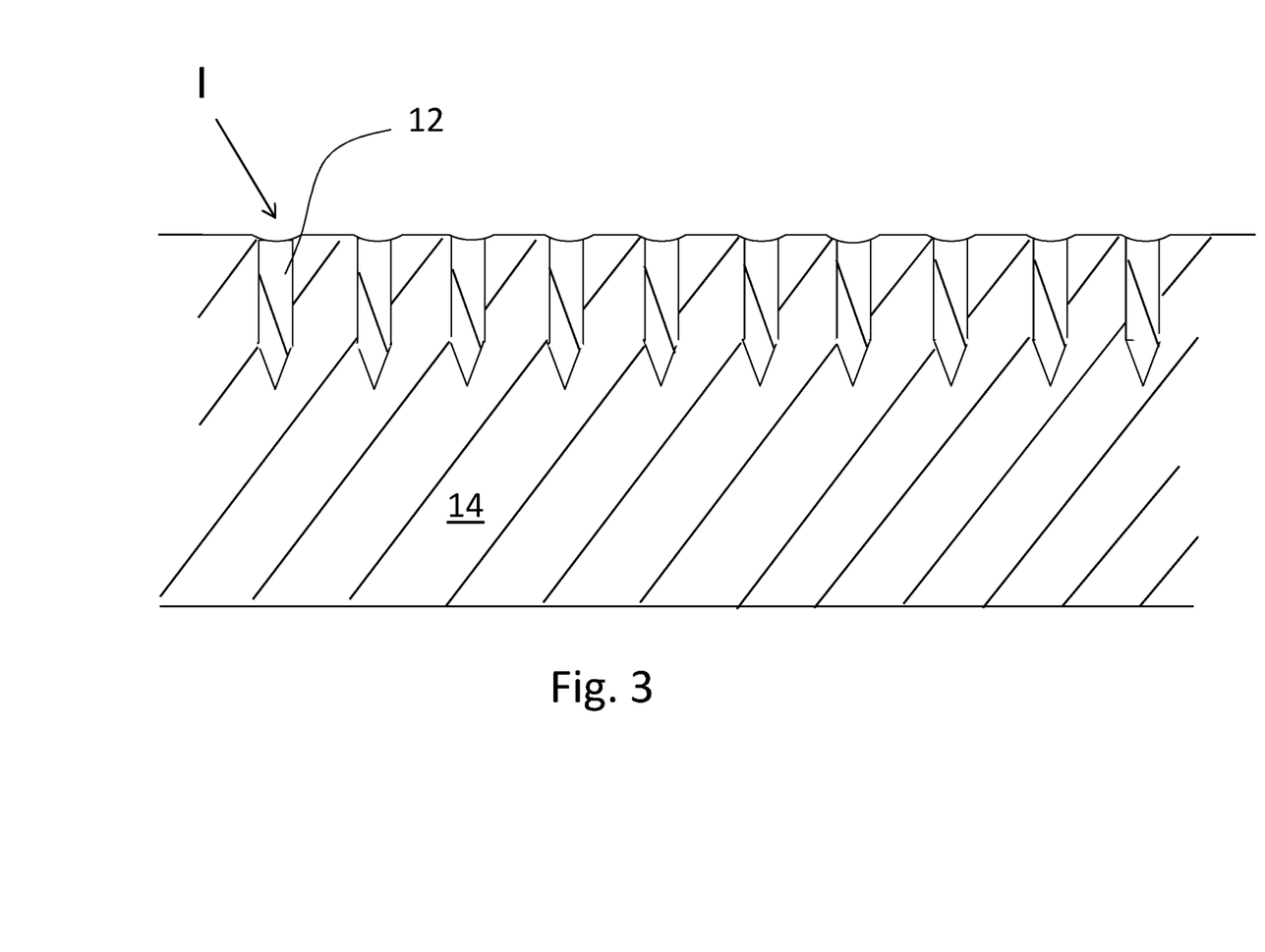
FIG. 3 illustrates a needle having a metal coating.

In FIG. 3 the substrate has been removed and as indicated schematically there are indentations I in the glass substrate in the area around the needles 11. A SEM picture of a real experiment is shown in FIG. 4 where these indentations are clearly seen.

Figure 4:
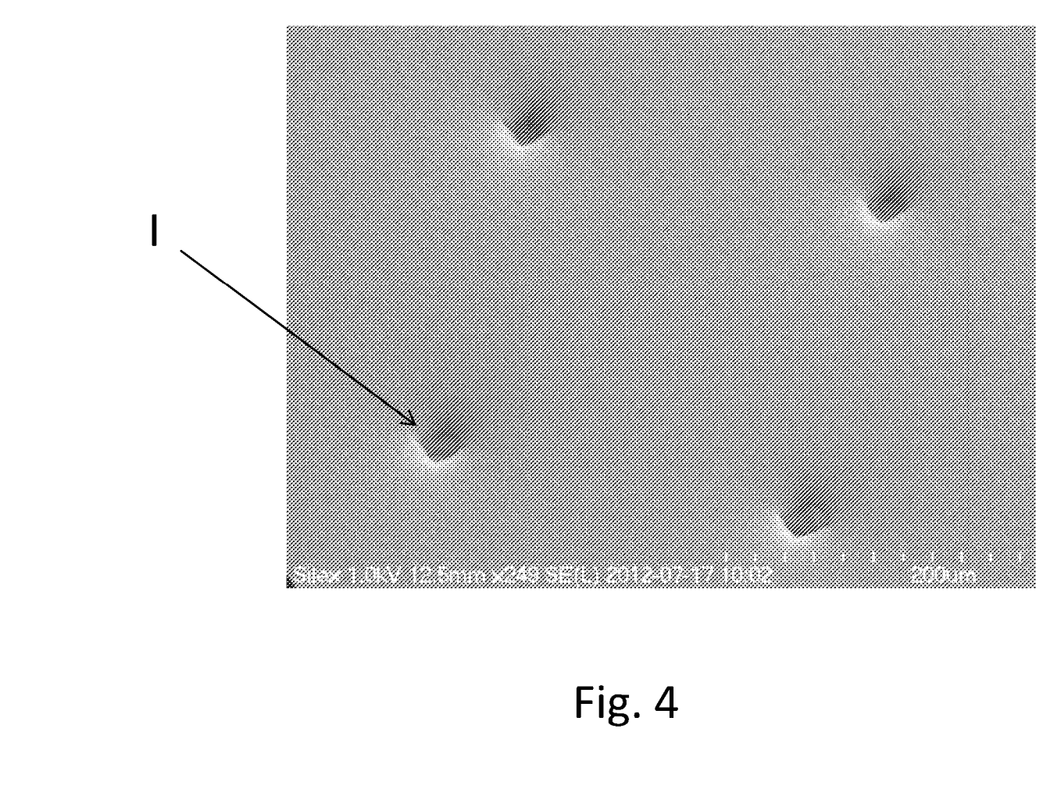
FIG. 4 illustrates an embodiment wherein the needle heads have diameter at the head base which is slightly larger than the diameter of the needle stem.
Figure 5:
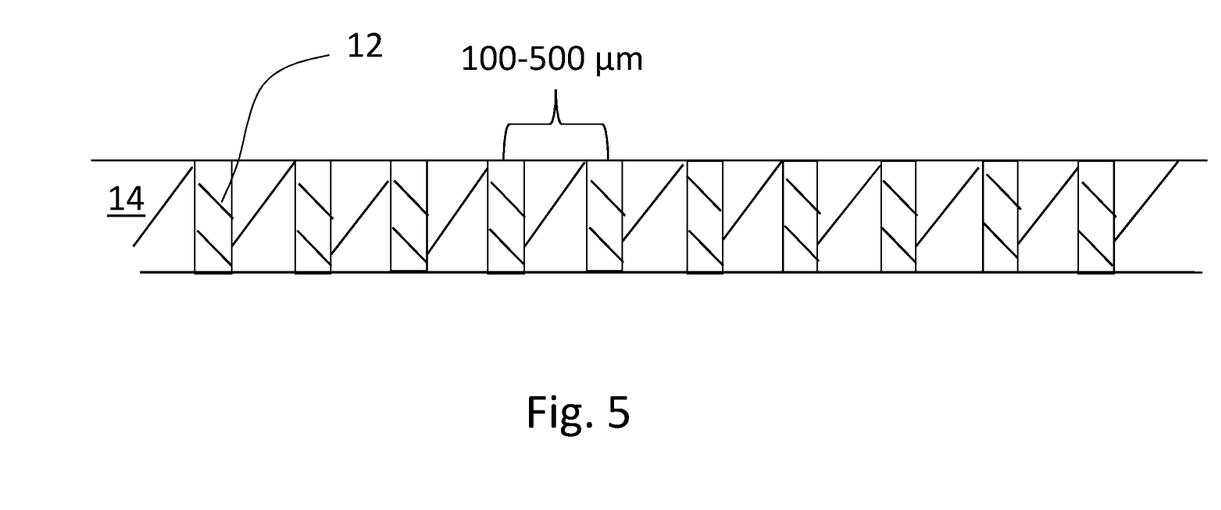
FIG. 5 illustrates the final structure obtained by the method.

The structure obtained and shown in FIGS. 3 and 4 is grinded on both sides to planarize the wafer. The bottom side (as seen in FIG. 3) is grinded to a point where the tips of the needles 11 have been removed, whereby the end result, shown in FIG. 5, is a thin glass wafer having silicon vias with a metal coating to provide highly conductive connections through the glass. Of course the conductivity is dependent on the material in the needles 11, and suitably the silicon is doped to increase conductivity. A resistance of down to 1Ω is obtainable using doped silicon.

In order to provide higher conductivity the needles 11 are suitably metallized. Such metallization can be obtained by different methods, such as plating (both electroplating and electroless plating), deposition of metal by physical techniques (PVD), chemical methods (CVD), ALD, evaporation, wet-chemistry i.e. deposition from solutions.

Preferred materials are metals or metal alloys, one preferred metal is copper (Cu). Alternatives to Cu could be Au, Ag, Pt, Ru. Sometimes for certain metals it is desirable to provide a barrier against diffusion of the metal into the silicon. Such barrier can be a layer of nickel (Ni), which can be deposited by similar methods as mentioned above. Other materials that are possible are tungsten (W), Ti, TiN, Ni, Ru, Ta and alloys thereof.

Figure 6:
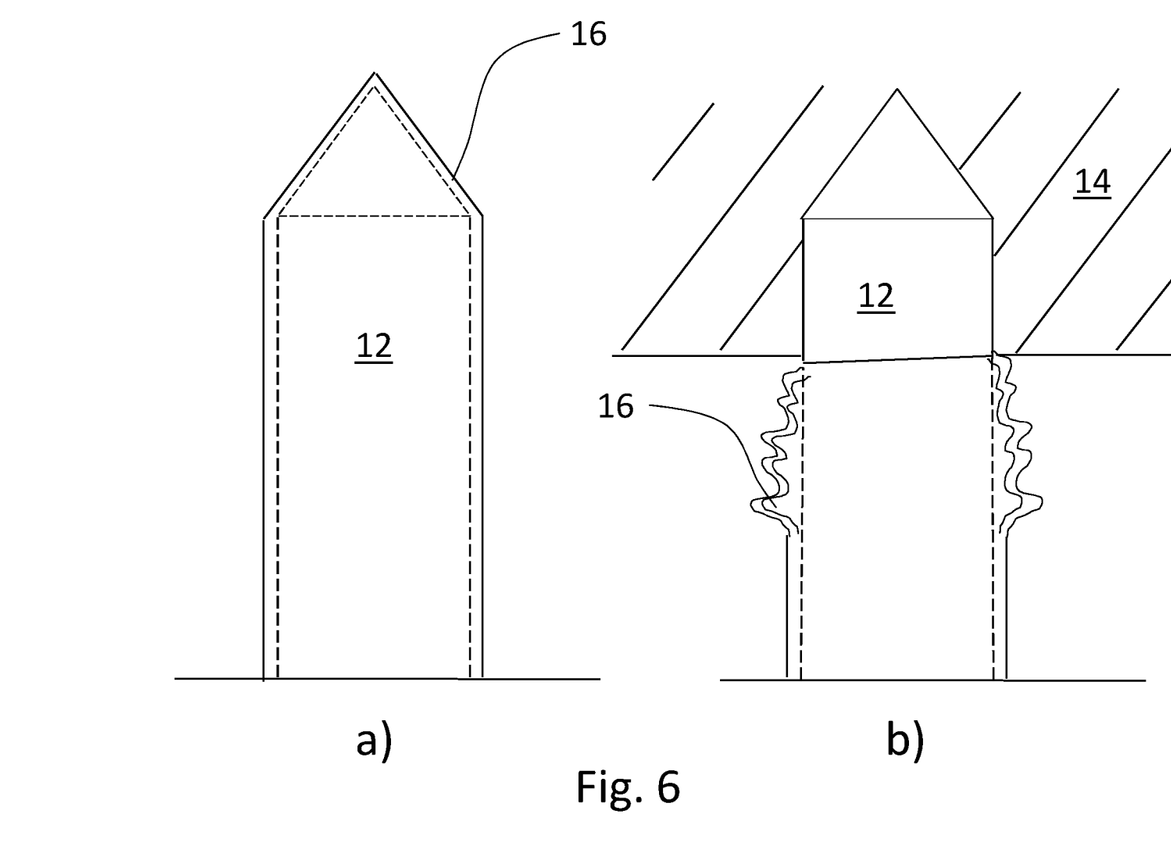
FIG. 6 illustrates peeling off metal during penetration.

However, a potential problem with metal coated needles is illustrated in FIG. 6. FIG. 6a shows a needle 11 coated with a metal coating 16. Now, if the adhesion of the metal to the silicon is not good enough, a "peeling off" of the metal coating can occur when the needle is pressed into the glass substrate. This is schematically illustrated in FIG. 6b, where it is shown how the metal coating 16 has come off from the part of the needle 11 that has penetrated the glass 14, and become "wrinkled" along the needle stem 12.

One way to remedy this is as follows.

Figure 7:
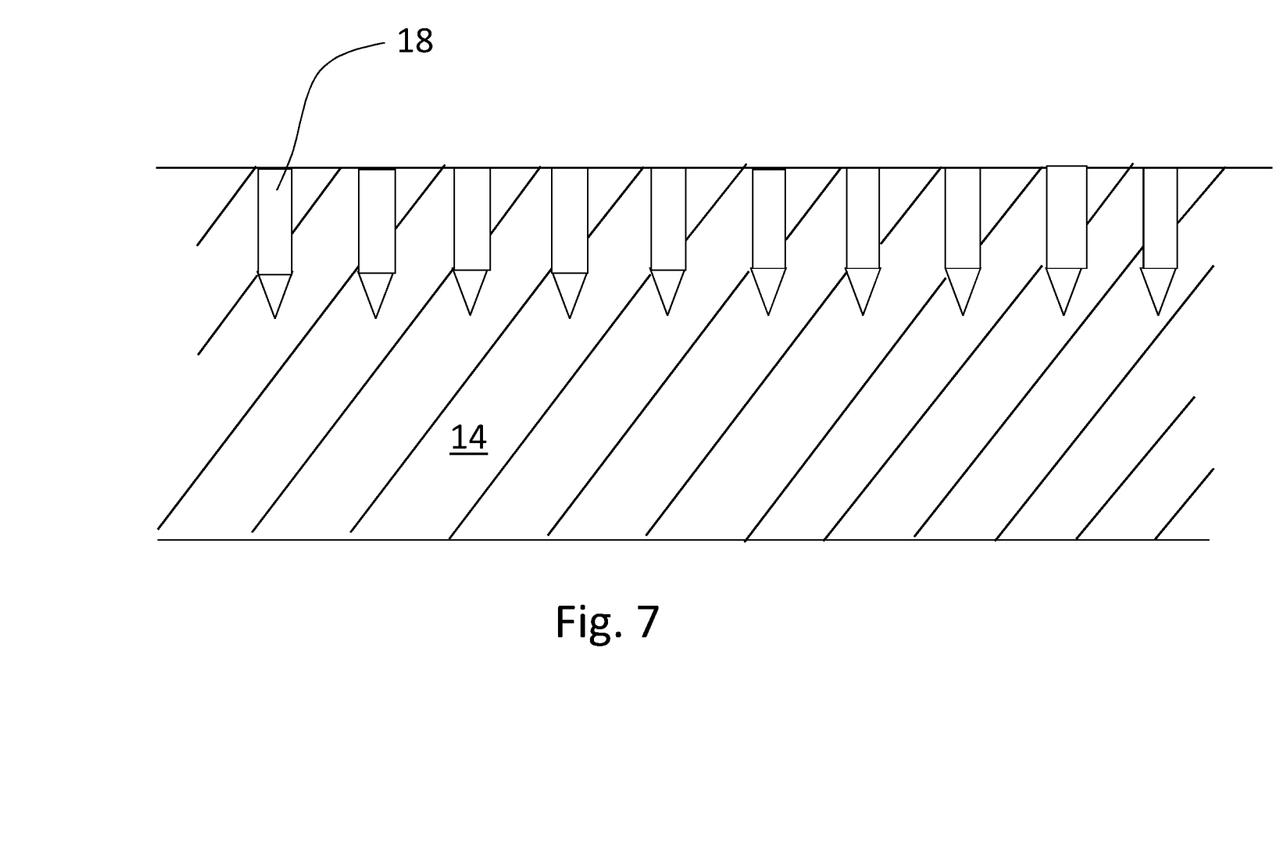
FIG. 7 illustrates an intermediate stage of an embodiment of the method.
Figure 8:
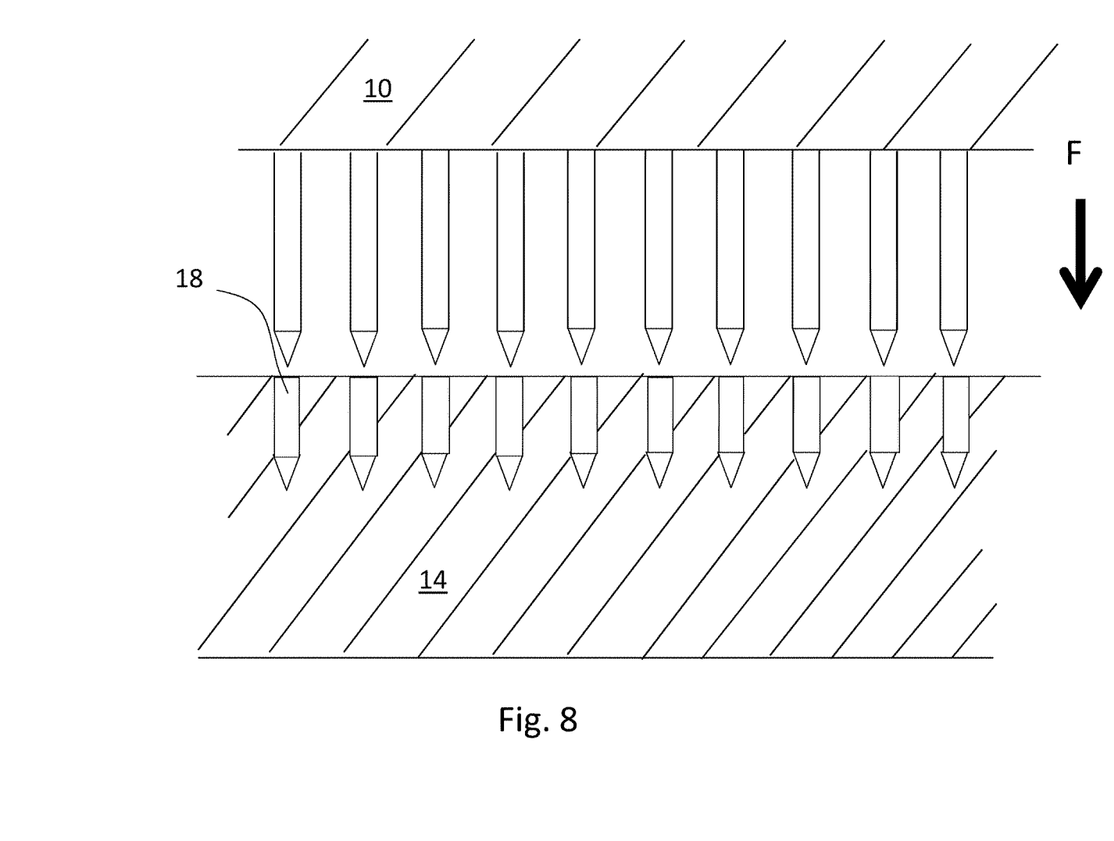
FIG. 8 illustrates a further step of an embodiment.

Namely, the method is performed in two steps, a first step where a needle carrying substrate, like the one shown in FIGS. 1 and 2, is pressed into a glass substrate. In this case the substrate and needles can be made from other materials than silicon, although silicon is preferred. However, instead of leaving the needles within the glass, the needle substrate is withdrawn, such that there will be holes formed in the glass. Alternatively, if the needles are made from e.g. silicon they can be etched away using wet etch such as KOH or the like, or using DRIE. This is shown in FIG. 7 wherein the holes obtained after removal by etching or mechanically removing them are designated with reference numeral 18. Then, a second needle substrate having metallized needles 12' (metallization not shown) with a diameter that is just a fraction larger than the hole 18 diameter is provided and aligned over the holes, see FIG. 8. When these needles are pressed into the holes the friction will not be so high that the metallization is peeled off.

Figure 9:
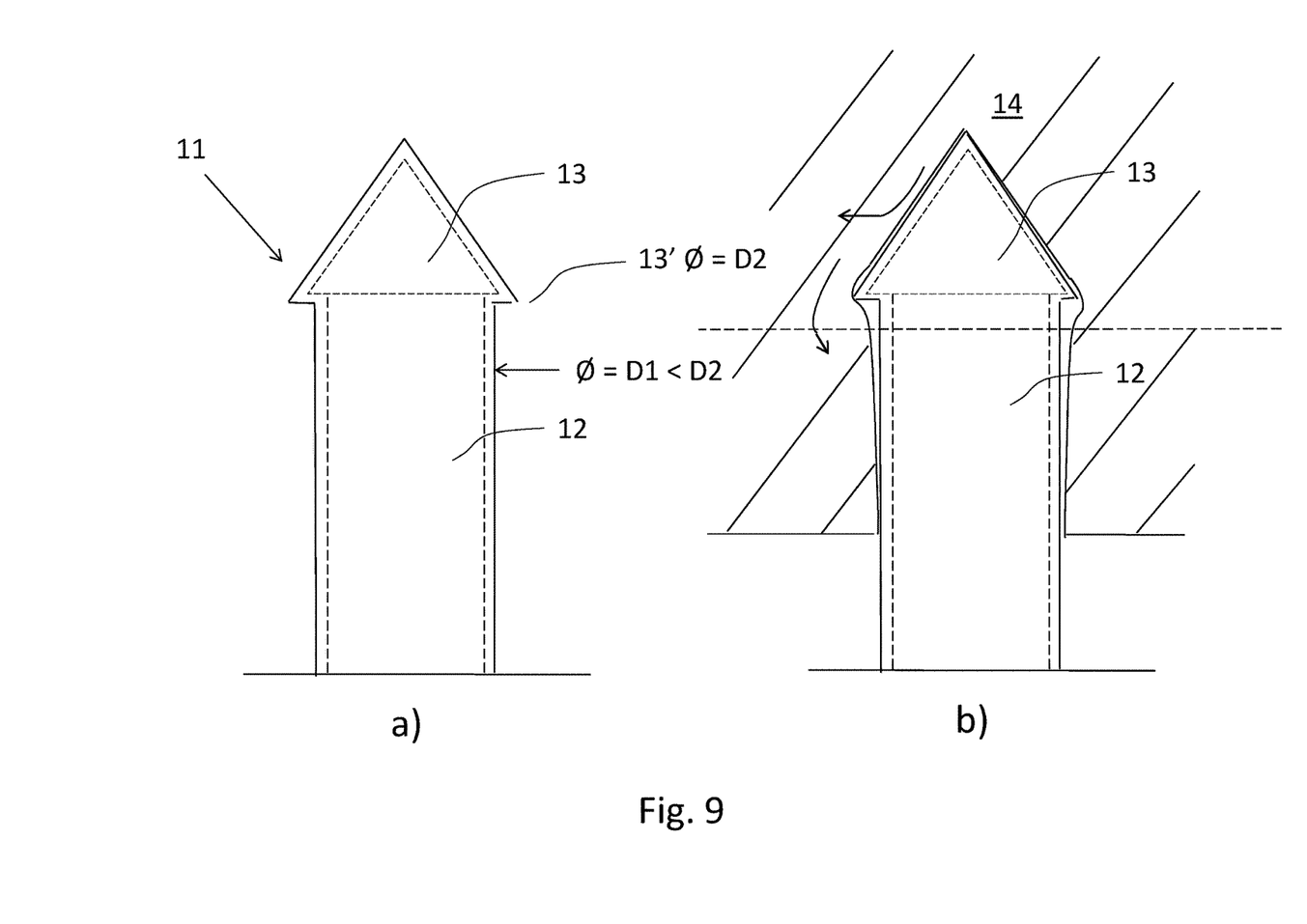
FIG. 9 illustrates an alternative geometry of needles usable in an embodiment of the method.

In a further embodiment the needles 11 are made as shown in FIG. 9a, namely such that the pointed or tapered needle head 13 has a diameter φ=D2 at its base 13', which is larger than the diameter φ=D1 of the needle stem 12. Suitably D2 is at least 3% larger than D1. In other words, the needle head 13 exhibits a slight overhang shielding or shadowing the needle stem 12.

This geometry will effectively function to "plough" through the glass 14, thereby protecting the metallization on the stem 12 from being peeled off. This is schematically illustrated in FIG. 9b, wherein it can be seen that the glass material is displaced but flows over the edge formed at the base of the needle tip without exerting force on the needle stem (schematically illustrated by arrows), thereby preventing that metal is peeled off. Of course it is possible that the metal on the actual needle head portion will be peeled off, but this is not important since the grinding to provide a planar surface will remove the needle head and any metal that is peeled away from the head.

The surface of the wafer after grinding is indicated with a broken line S in FIG. 9b.

The product obtained by the above described processes is generically described as a wafer of a material having a low dielectric constant and with vias of metal extending through the wafer.

This wafer is usable as a "capping structure" or simply "cap" for covering and sealing off cavities in e.g. MEMS devices. Examples of components that are provided in sealed cavities are resonators, RF switches, accelerometers, gyros etc.

In particular when the component is a capacitive sensor the deflections causing capacitive changes are extremely small, and the delta C is in the order of femto-Farad to atto-Farad. Such small delta C would be completely "drowned" in the stray capacitances caused if the substrate in which the vias are provided is e.g. silicon. If a glass substrate made according to the present invention is used these stray capacitances become negligible or at least controllable.

Thus, for making such devices using the technology disclosed herein for capping purposes, a semiconductor wafer is suitably processed to provide a depression usable as a vacuum cavity in which a functional component can be accommodated and can move freely. Suitable routing structures are made so as to provide points of contact on the field of the wafer, i.e. on the planar surface surrounding the depressions.

Figure 10:
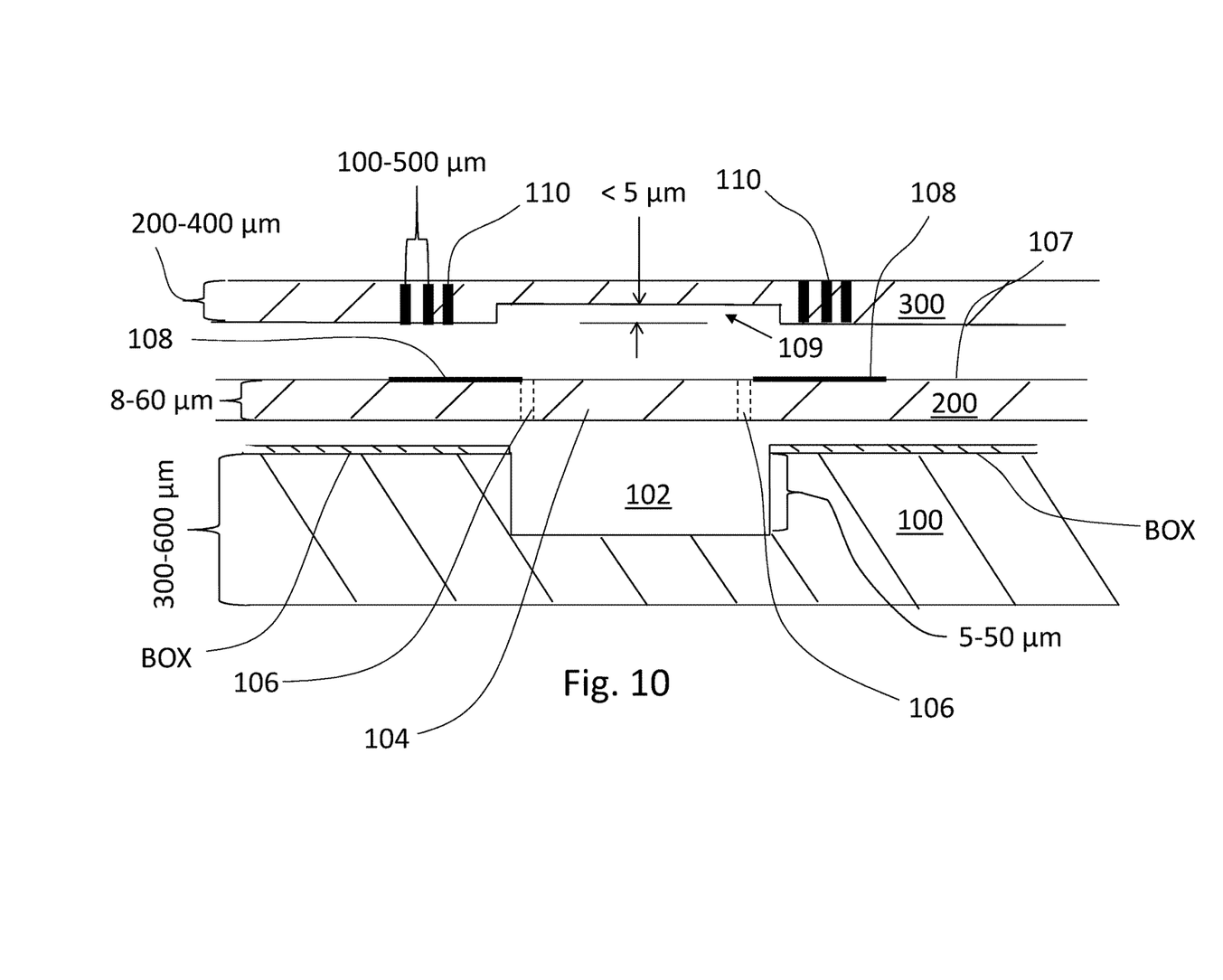
FIG. 10 shows schematically a process for making a device using a cap wafer made according to the method.

Reference is made to FIG. 10 which schematically illustrates the process. It should be noted that the figures are not to scale, and also that individual wafers (substrates) are not necessarily provided as separate pieces in the process, as will be disclosed below.

Thus, a semiconductor wafer 100, generally 300-600 μm thick, is shown in which a depression 102 is formed, suitably 5-50 μm deep, this depression in many applications being used as a vacuum cavity. In other applications the cavity can be filled with a controlled atmosphere comprising a suitable gas at a suitable pressure.

A second wafer 200 is provided, suitably 8-60 μm thick, in which a monolithically integrated component 104 is made, e.g. a deflectable member connected to the surrounding structure by means of hinges 106, e.g. gimbals or other structures enabling motion in one or more directions. These hinges 106 are schematically illustrated with broken lines.

Suitable routing 108 is made to provide for points of contact on the wafer field area 107. The routing structure is only schematically illustrated and can comprise fairly complex patterns for fanning out etc. However, this forms no part of the invention per se, and the skilled man will be able to design such routing structures without inventive work.

The first and second wafers are normally provided together as a so called C-SOI wafer, commercially available, wherein the first wafer 100 is the handle part of the C-SOI, and the second wafer 200 is the device layer of the C-SOI. Such composite wafers can even be obtained prefabricated with a depression 102. In the case a C-SOI is used there is a buried oxide layer BOX provided between the device and handle parts, respectively. Thus, a BOX is never in reality provided as shown in FIG. 10, but is integrated in the C-SOI. It will be necessary to use some carrier structure for the second wafer due to it being very thin—it would not be possible to handle it otherwise, and the use of a C-SOI enables such handling.

However, it is also possible to provide the first wafer 100 as a separate wafer, but then it would be necessary to use a SOI wafer the device layer of which would constitute the second wafer 200 in which the MEMS component is integrated. The handle layer would then be removed before finishing the structure. In this case the oxide layer BOX in FIG. 10 would not be present.

A third wafer 300, normally 200-400 μm thick, obtained by any of the methods described above, i.e. comprising a material having low dielectric constant, such as glass, and having TSVs 110 provided in positions matching the routing structures 108 is provided. It is notable that the pitch of the TSVs 110 can be made tight, 100-500 μm. In this wafer a very shallow depression 109, <5 μm deep, is made by suitable methods, such as etching, and provided so as to match the component 104 in the second wafer 200. This is required if the component is to be freely movable.

Figure 11:
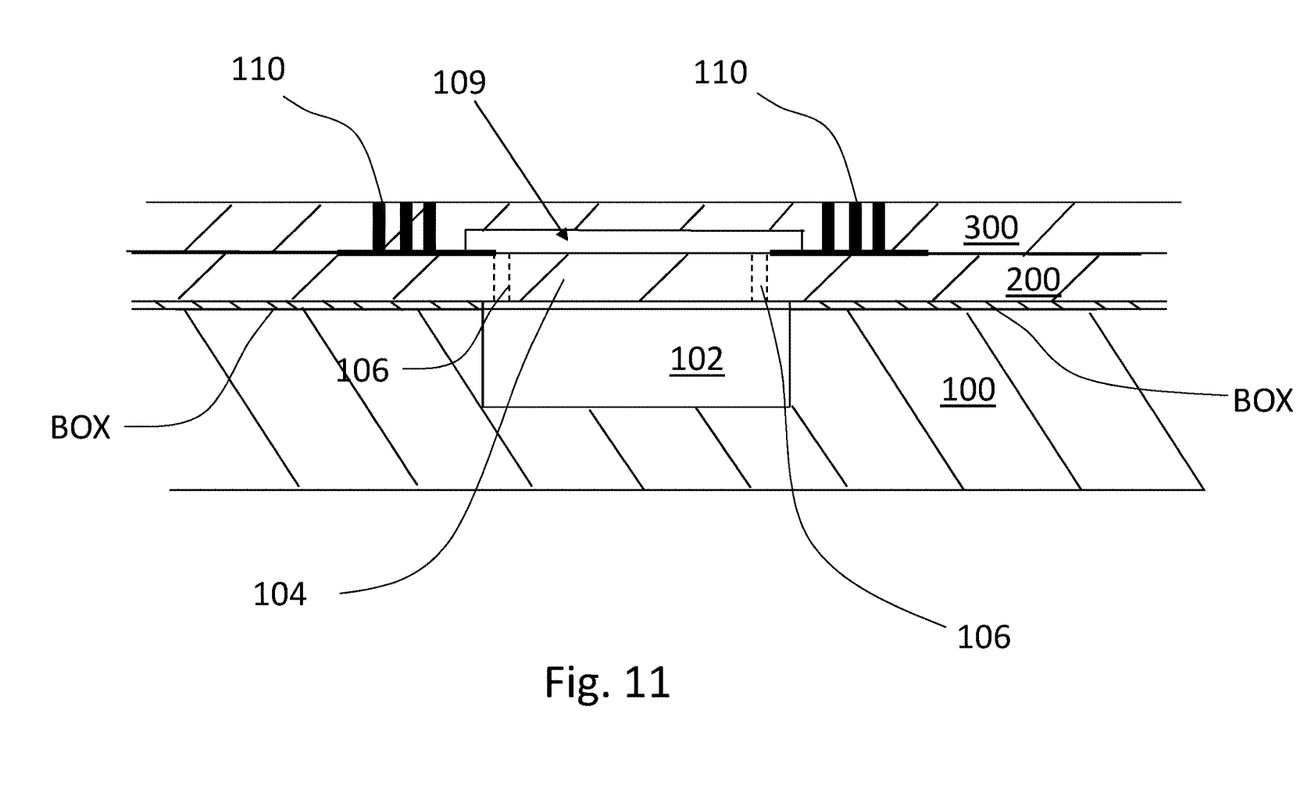
FIG. 11 is a schematic illustration of a device.

Now, when the structure comprising the first and second wafers with a depression 102 and the desired MEMS component 104 has been obtained, the third wafer comprising the vias is bonded to the package of the first and second wafers, to obtain a structure as schematically illustrated in FIG. 11.

The invention claimed is:

1. A device, comprising:
   a MEMS component (104),
   a silicon substrate (100; 200) having a cavity (102) in which the MEMS component (104) is accommodated,
   a cap wafer (300) bonded to the silicon substrate and extending over the cavity (102) and the MEMS component (104),
   the cap wafer being a glass wafer 200-400 μm thick,
   high conductivity vias extending through the cap wafer, the vias comprising a core of silicon, a diffusion barrier against the silicon, and a metal coating against the diffusion barrier, the diffusion barrier preventing metal diffusion into the silicon, the diffusion barrier being a layer of an element from the group consisting of Ni, W, Ti, TiN, Ni, Ru, and Ta and alloys thereof, and
   a depression (109) within the cap wafer, the depression being directed toward and located over the MEMS component (104) and over the cavity (102) of the silicon substrate, the depression for accommodating movements of said MEMS component (104).

2. The device according to claim 1, wherein the MEMS component (104) is monolithically integrated in a portion of the silicon substrate (200) provided between the cavity (102) of the silicon substrate (100) and the depression (109) within the cap wafer (300).

3. The device according to claim 1, wherein a pitch via-to-via is in a range of 100-500 μm.

4. The device according to claim 1, wherein the metal coating comprises a member of the group consisting of copper (Cu), Au, Ag, Pt and Ru, and alloys combinations of copper (Cu), Au, Ag, Pt and Ru.

5. The device according to claim 1, wherein the metal coating is a plated coating.

6. The device according to claim 1, wherein the silicon of the vias have a resistance of at least 1 Ω.

\* \* \* \* \*

UNITED STATES PATENT AND TRADEMARK OFFICE
CERTIFICATE OF CORRECTION

| | |
|---|---|
| PATENT NO. | : 9,607,915 B2 |
| APPLICATION NO. | : 14/440084 |
| DATED | : March 28, 2017 |
| INVENTOR(S) | : Ulf Erlesand, Edvard Kälvesten and Thorbjörn Ebefors |

It is certified that error appears in the above-identified patent and that said Letters Patent is hereby corrected as shown below:

On the Title Page

Left Column:
"(72) Inventors: Ulf Erlesand, Osterskar (SE); Edvard Kälvesten, Hagersten (SE)"

Should be replaced with:
-- (72) Inventors: Ulf Erlesand, Osterskar (SE); Edvard Kälvesten, Hagersten (SE); Thorbjörn Ebefors, Huddinge (SE) --.

Signed and Sealed this
Nineteenth Day of September, 2017

Joseph Matal
*Performing the Functions and Duties of the*
*Under Secretary of Commerce for Intellectual Property and*
*Director of the United States Patent and Trademark Office*